US012020915B1

(12) United States Patent
Enshasy

(10) Patent No.: US 12,020,915 B1
(45) Date of Patent: Jun. 25, 2024

(54) RESONANT FREQUENCY SHIFT AS ETCH STOP OF GATE OXIDE OF MOSFET TRANSISTOR

(71) Applicant: KING FAISAL UNIVERSITY, Al-Ahsa (SA)

(72) Inventor: Hesham Mohammed Enshasy, ALHasaa (SA)

(73) Assignee: KING FAISAL UNIVERSITY, Al-Ahsa (SA)

( * ) Notice: Subject to any disclaimer, the term of this patent is extended or adjusted under 35 U.S.C. 154(b) by 0 days.

(21) Appl. No.: 18/414,436

(22) Filed: Jan. 16, 2024

(51) Int. Cl.
*H01L 21/66* (2006.01)
*H01J 37/32* (2006.01)

(52) U.S. Cl.
CPC ........ *H01J 37/32963* (2013.01); *H01L 22/26* (2013.01); *H01J 2237/24592* (2013.01); *H01J 2237/334* (2013.01)

(58) Field of Classification Search
CPC .................................................. H01J 37/32963
See application file for complete search history.

(56) References Cited

U.S. PATENT DOCUMENTS

| 2019/0287758 | A1* | 9/2019 | Pan | H10N 30/06 |
| 2021/0104405 | A1 | 4/2021 | Kim et al. | |
| 2024/0035896 | A1* | 2/2024 | Lin | H01J 37/32917 |

FOREIGN PATENT DOCUMENTS

| WO | 2019036139 A1 | 2/2019 |
| WO | 2019036587 A1 | 2/2019 |
| WO | 2019040843 A1 | 2/2019 |
| WO | 2019245729 A1 | 12/2019 |
| WO | 2021178464 A1 | 9/2021 |

OTHER PUBLICATIONS

Jeffrey Miller, John Wright, Huili Grace Xing, and Debdeep Jena, "All-Epitaxial Bulk Acoustic Wave Resonators" DOI: https://doi.org/10.1002/pssa.201900786; 2020.
B Platier, T J A Staps, C C J M Hak, J Beckers and W L IJzerman, "Resonant microwaves probing acoustic waves from an RF plasma jet" DOI 10.1088/1361-6595/ab7d8e; 2020.

* cited by examiner

*Primary Examiner* — Binh X Tran
(74) *Attorney, Agent, or Firm* — Nath, Goldberg & Meyer; Richard C. Litman

(57) ABSTRACT

An etch process performed during semiconductor processing is monitored using a resonant structure on a surface of a wafer, formed on the surface of a wafer as a resonant cavity. A resonance sensor is positioned over the wafer within a plasma etch chamber so as to establish a resonance with the resonant structure. A resonant frequency of the resonant structure is sensed through the resonant structure and shifts in the resonant frequency are thereby detected during an etch process as a measurement of the etch process. The etch process is controlled in accordance with the shift in the resonant frequency.

9 Claims, 2 Drawing Sheets

RESONANT FREQUENCY SHIFT AS ETCH STOP OF GATE OXIDE OF MOSFET TRANSISTOR

BACKGROUND

Technical Field

The present disclosure relates to semiconductor processing using a sensor that exhibits the required sensitivity for monitoring a critical process and it relies on a resonant cavity filter as its core component.

Background Art

Utilization of a resonant frequency filter for the analysis or precise control of the etching process within the wafer processing chamber, and the use of acoustic signals generated within the wafer processing chamber for the control of wafer etch processing has been proposed or implemented. Various approaches include control of an etch process being regulated by a resonant filter. Another approach uses a surface acoustic wave sensor, in which the surface acoustic wave sensor utilizes the acoustic signal within the wafer processing chamber.

A resonant filter can be used to regulate etch processing. For example, WO2019040843A1, to Rinzan, et al., discloses etch processing regulated by the resonant filter, in which the resonant filter gauges changes in resonant frequency by detection of a frequency shift and alterations in acoustic impedance, thereby controlling the etching process.

WO2021178464A1, to Lapidot, et al., discloses controlling an etching process through the utilization of both a QCM (Quartz Crystal Microbalance) sensor and a surface acoustic wave sensor. The real-time etching process is calculated and/or controlled by combining the data from these two sensors. The QCM sensor relies on the reflected resonance signal, while the surface acoustic wave sensor utilizes the acoustic signal within the wafer processing chamber.

SUMMARY

Monitoring an etch process performed during semiconductor processing is performed using a resonant structure on a surface of a wafer. A resonant structure is formed on a surface of a wafer to form a resonant cavity. A resonance sensor is positioned over the wafer so as to establish a resonance with the resonant structure. A resonant frequency of the resonant structure is sensed through the resonant structure and shifts in the resonant frequency are thereby detected during an etch process as a measurement of the etch process. The etch process is controlled in accordance with the shift in the resonant frequency.

In one configuration, the etch process comprises a plasma etch process.

DETAILED DESCRIPTION

Overview

It is desired, when using resonant measurements for semiconductor processing, such as implementing semiconductor etch processes, to provide a single sensor circuit positioned over the wafer processing chamber, capable of measuring both resonant frequency shift and acoustic signal variation. It is further desired, in a plasma etch process, to control of the plasma etching process based on the measured variations in both frequency shift and acoustic signals.

As used herein, "semiconductor" and "semiconductor processing" is intended to be inclusive of operations performed on semiconductor wafers, quartz wafers, piezoelectric crystal material, materials used to construct solar cells and other materials subject to semiconductor processing such as plasma etch.

In the realm of MOSFET transistors, precise control over the ultra-thin oxide layer is of paramount importance. The gate oxide, typically measured in tens of angstroms, necessitates a level of control down to a monolayer thickness for optimal device performance. According to the present disclosure, a sensor that exhibits the required sensitivity is used for monitoring this critical process. This sensor relies on a resonant cavity filter as its core component, and the resonant cavity filter operates by allowing a propagating wave to reflect multiple times. The resonant cavity filter is incorporated in the etching system where the sensor gets etched as the gate oxide of the MOSFET transistor wafer gets etched.

Maximum reflection is achieved when the following formula is satisfied:

$$F = \frac{V}{2\lambda} \quad \text{(Eqn. 1)}$$

where F is the resonant frequency of the cavity, V is the acoustic wave at the surface through reflective structures, and λ is the reflective grating period.

Figure 1:
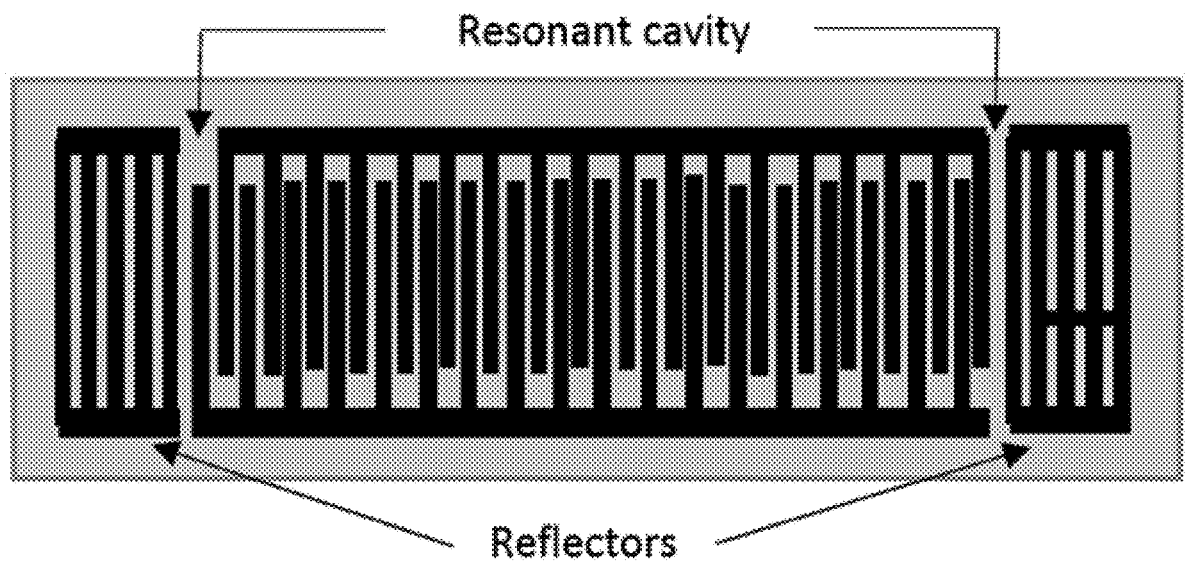
FIG. 1 is a schematic diagram showing a resonant structure in a plan view, which is used as the active part of a resonant circuit.

FIG. 1 is a schematic diagram showing a resonant structure in a plan view, which is used as the active part of a resonant circuit. The resonant structure, which during an etch process is used as part of the resonant circuit, includes a resonant sensor located in an etch chamber such as a plasma etch chamber. These devices can work in a superior manner to their counterparts at the UHF level because they can be made efficient and frequency selective. By depositing the metal film on a piezoelectric substrate in the form of gratings, and controlling the thickness of the gratings and the cavity length and depth between them, only a very narrow frequency band wave can pass through the device. In more detail, the length of the cavity should equal one half of the wave-length.

The resonant structure is fabricated from a thin metal layer, often aluminum, deposited via sputtering, evaporation or vapor deposition onto a substrate made of piezoelectric crystal material, such as quartz. The deposited metal layer is deposited through a photomask or deposited or etched through a photomask to take the form of two sets of interlocked fingers or gratings, electrically insulated from each other. The precise dimensions of these gratings, along with the cavity length and depth between them, enable the passage of a narrow frequency band wave through the device. The center frequency (CF) of the resonance structure is influenced by the weight of the metal layer atop the piezoelectric crystal. This approach capitalizes on the nearly identical densities of aluminum and the substrate:

Quartz=2.65 g/cm$^3$

Aluminum=2.7 g/cm$^3$

The use of an aluminum conductive layer is given by way of non-limiting example, as the conductive layer may be formed of any suitable metal or other conductor.

Figure 2:
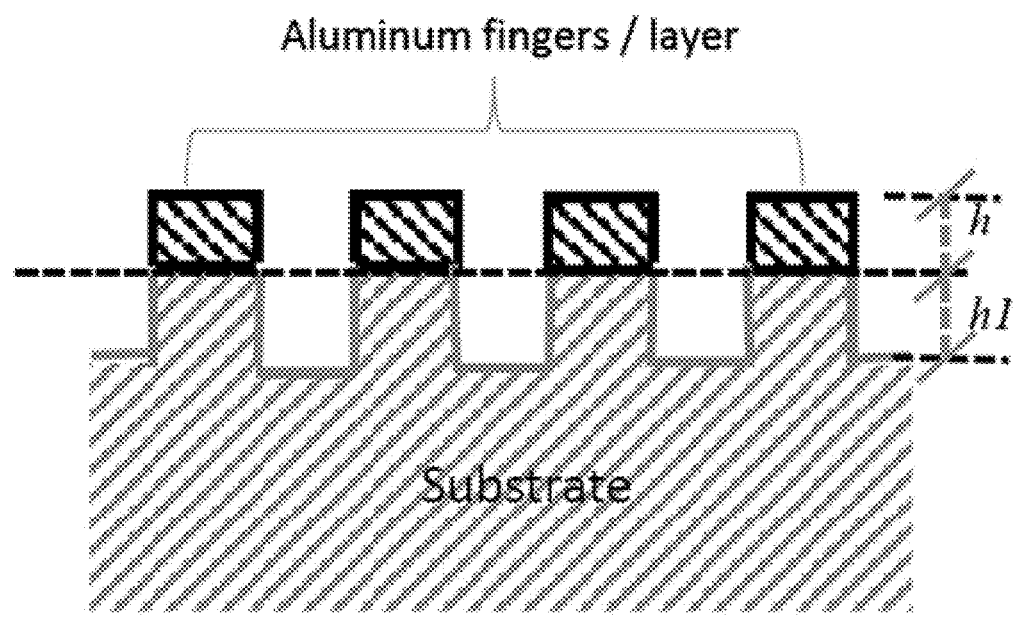
FIG. 2 is a schematic diagram showing a cross-sectional view of a resonant cavity formed on a substrate, in which a controlled etching process is used to etch aluminum fingers of a resonant cavity formed on the substrate.

FIG. 2 is a schematic diagram showing a cross-sectional view of a resonant cavity formed on a substrate, in which a controlled etching process is used to etch aluminum into fingers of a resonant cavity formed on the substrate. In a controlled etching process, such as groove etching $h_1$, effectively mimics an increase in the thickness of the aluminum layer.

In this approach, the aluminum electrodes function as a mask, guiding the etching process applied to the quartz or silicon substrate. Since the etchant that is used for the MOSFET gate oxide is the same etchant for the quartz material, a substantial shift in the frequency is anticipated with each monolayer removal of quartz material. This shift can be directly correlated with the depth of gate oxide etching, providing a robust and precise means of monitoring the process. To calculate the frequency shift ΔF, the following formula is used in practice:

$$\frac{\Delta F}{F} = \left(\frac{-h}{\lambda^2}\right)(0.4d + 7h + 3.5h_1) \quad \text{(Eqn. 2)}$$

wherein ΔF is the shift in the resonant frequency, F is the resonant frequency of the resonant structure, h is a thickness of the resonant structure, λ is a reflective grating period of the resonant structure, d is an electrode width of the resonant structure, and $h_1$ is a groove etching depth in the wafer.

Figure 3:
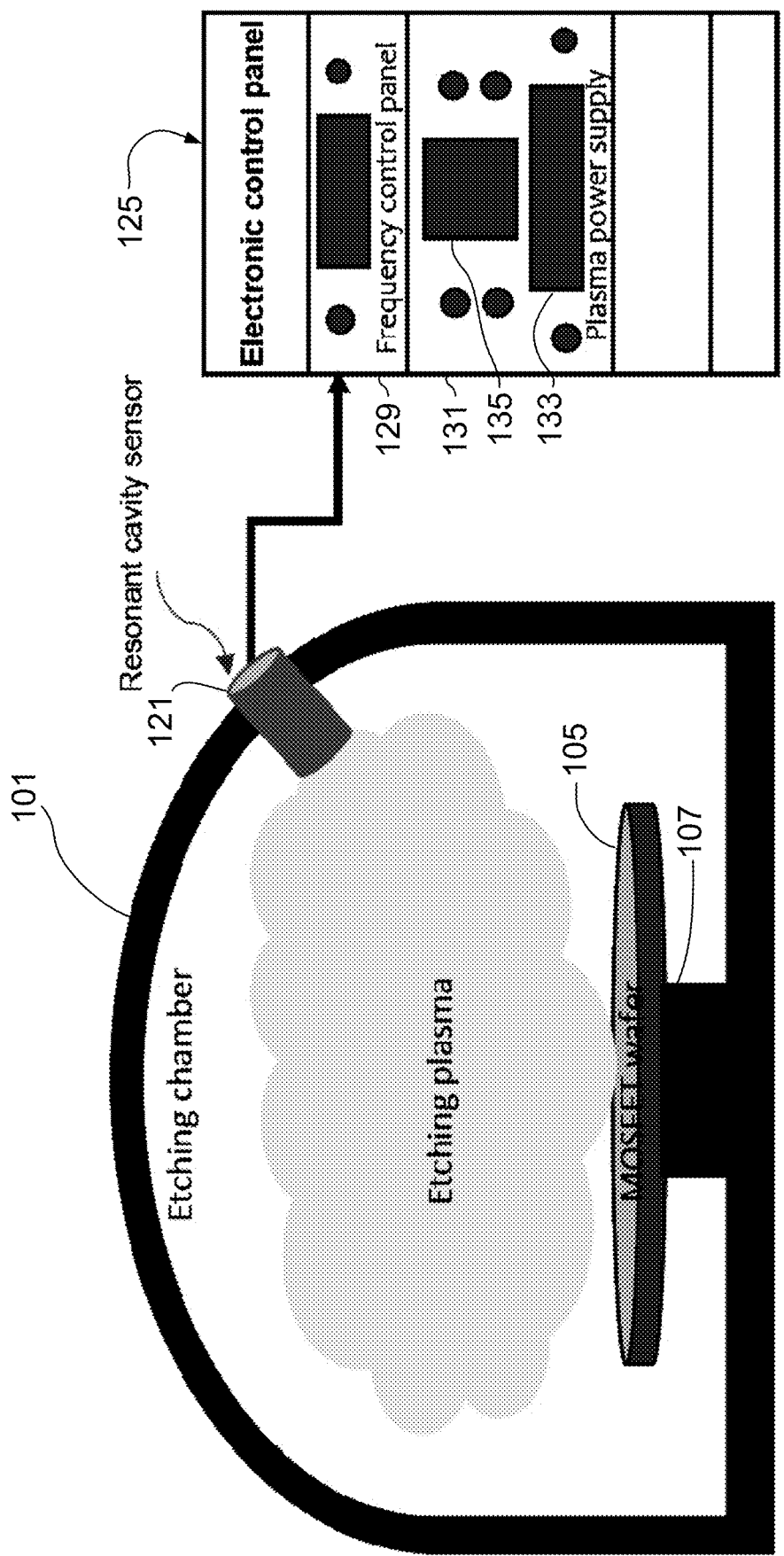
FIG. 3 is a schematic diagram showing a configuration for performing plasma etch using the resonant cavity of FIGS. 1 and 2.

FIG. 3 is a schematic diagram showing a configuration for performing plasma etch using the resonant cavity of FIGS. 1 and 2. Depicted are plasma etch chamber 101, in which semiconductor wafer 105 is supported on cathode 107 for a plasma etch process. The arrangements of the plasma gas inlet and anode are conventional and not shown for purposes of clarity, but are known to skilled artisans. Also shown is resonant cavity sensor 121, which is a transceiver operating in a predetermined range of resonant frequencies. Electronic control unit 125 includes frequency control unit 129 and has a power supply that may be integrated with plasma power supply 131. In the non-limiting example shown, electronic control unit 125 includes frequency control unit 129, and plasma power supply 131. Plasma power supply 131 includes plasma power supply output circuit 133 and plasma power supply controller 135, which functions as a process control circuit. In the non-limiting example, the plasma power supply controller 135 is linked with frequency control unit 129, to receive indications of the resonant frequency as detected by resonant cavity sensor 121 and provide power to frequency control unit 129, which is connected to resonant cavity sensor 121.

The details of the connection and control circuits are given as non-limiting examples, as the functional operation is to control the plasma in accordance with resonant frequency, which is indicative of the depth of the plasma etch. Frequency control unit 129 is used to transmit and receive signals to determine the depth of the plasma etch. FIG. 3 shows the resonant cavity filter incorporated in the etching system, in which the sensor is etched, by way of non-limiting example as the gate oxide of a MOSFET transistor wafer. A scaling factor is needed to correlate the etch rate of the MOSFET gate oxide to the etch rate to sensor cell, as is well known to skilled artisans. As the etching process starts, h will decrease where each monolayer that will be etched will shift the frequency in a measurable manner according to equation (2). This process will translate as a monolayer control on the gate oxide etch of the MOSFET wafer.

CLOSING STATEMENT

It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A method for monitoring an etch process performed during semiconductor processing, the method comprising:
   forming a resonant structure on a surface of a wafer, the wafer including a semiconductor material, the resonant structure forming a resonant cavity;
   positioning a resonance sensor over the wafer so as to establish a resonance with the resonant structure;
   sensing a resonant frequency of the resonant structure through the resonant structure and detecting a shift in the resonant frequency during an etch process as a measurement of the etch process; and
   controlling the etch process in accordance with the shift in the resonant frequency,
   wherein the shift in the resonant frequency is measured according to:

$$\frac{\Delta F}{F} = \left(\frac{-h}{\lambda^2}\right)(0.4d + 7h + 3.5h_1),$$

wherein ΔF is the shift in the resonant frequency, F is the resonant frequency of the resonant structure, h is a thickness of the resonant structure, λ is a reflective grating period of the resonant structure, d is an electrode width of the resonant structure, and $h_1$ is a groove etching depth in the wafer.

2. The method as described in claim 1, wherein the etch process comprises a plasma etch process.

3. The method as described in claim 1,
   wherein the semiconductor material included in the wafer is a piezoelectric crystal material, and wherein the forming of the resonant structure includes depositing a conductive layer on the surface of the wafer,
   wherein the deposited conductive layer takes a form of two sets of interlocked fingers or gratings, electrically insulated from each other.

4. The method as described in claim 1,
   wherein the semiconductor material included in the wafer is a piezoelectric crystal material, and wherein the forming of the resonant structure includes depositing a metal layer via sputtering or vapor deposition on the surface of the wafer.

5. The method as described in claim 1,
   wherein the semiconductor material included in the wafer is a piezoelectric crystal material, and wherein the forming of the resonant structure includes depositing aluminum as a metal layer via sputtering or vapor deposition on the surface of the wafer.

6. The method as described in claim 1, wherein the semiconductor material included in the wafer is a piezoelectric crystal material, and wherein the forming of the resonant structure includes depositing a metal layer via sputtering or vapor deposition on the surface of the wafer, wherein the deposited metal layer takes a form of two sets of interlocked fingers or gratings, electrically insulated from each other.

7. The method as described in claim 1, wherein the semiconductor material included in the wafer is a piezoelectric crystal material, and wherein the forming of the resonant structure includes depositing aluminum as a metal layer via sputtering or vapor deposition on the surface of the wafer, wherein the deposited metal layer takes a form of two sets of interlocked fingers or gratings, electrically insulated from each other.

8. The method as described in claim 1, wherein the semiconductor material is quartz.

9. The method as described in claim 1, wherein the semiconductor material is a piezoelectric crystal material.

* * * * *